United States Patent
Hossain et al.

(10) Patent No.: US 6,911,845 B2
(45) Date of Patent: Jun. 28, 2005

(54) PULSE TRIGGERED STATIC FLIP-FLOP HAVING SCAN TEST

(75) Inventors: Razak Hossain, San Diego, CA (US); Marco Cavalli, Gambara (IT)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/249,353

(22) Filed: Apr. 2, 2003

(65) Prior Publication Data

US 2004/0196067 A1 Oct. 7, 2004

(51) Int. Cl.$^7$ ............................................. H03K 19/096
(52) U.S. Cl. ..................... 326/93; 326/113; 326/98; 326/95; 327/200; 327/208; 327/218; 327/211; 327/213
(58) Field of Search ............................ 326/93, 95, 98, 326/113; 327/208–212, 214, 224, 225; 714/724, 725

(56) References Cited

U.S. PATENT DOCUMENTS 5,189,319 A * 2/1993 Fung et al. .................. 326/86
5,625,303 A * 4/1997 Jamshidi .................... 326/106
6,448,829 B1 * 9/2002 Saraf ......................... 327/200
6,686,775 B2 * 2/2004 Campbell .................... 326/93

OTHER PUBLICATIONS

Harris, Skew–Tolerant Circuit Design, Academic Press, 2001, pp. 51–60, 211–217.

* cited by examiner

Primary Examiner—Vibol Tan
(74) Attorney, Agent, or Firm—Lisa K. Jorgenson; Andre M. Szuwalski

(57) ABSTRACT

A testable, pulse-triggered static flip-flop. A pulse generator produces a data enable trigger pulse only when a test enable input is low, and a scan test enable trigger pulse only when a test enable input is high. The data enable trigger pulse controls the data input to the flip-flop, while the scan test enable trigger pulse controls the scan test input to the flip-flop. The flip-flop consists of a selection circuit comprised of two latches, each including an inverter and a transmission gate. One latch receives the data input and the other latch receives the scan test input. The data enable trigger pulse controls the transmission gate receiving the data input, and the scan test trigger pulse controls the transmission gate receiving the scan test input. The flip-flop also includes a keeper circuit consisting of a feedback inverter and a static latch.

20 Claims, 2 Drawing Sheets

PULSE TRIGGERED STATIC FLIP-FLOP HAVING SCAN TEST

BACKGROUND OF INVENTION

1. Field of Invention

The present invention relates to improvements in digital logic circuits, and more particularly to improvements in pulsed static logic circuits, and still more particularly to an improved pulsed static logic circuit that can be scanned for testing purposes.

2. Relevant Background

Flip-flops are a basic building block for digital logic circuits. They are the most common memory element in digital logic design, being used almost exclusively in synthesized designs, and widely used in custom implementations as well. Static logic flip-flops typically comprise Complementary Metal Oxide Silicon (CMOS) technology.

The output (Q) of a typical static logic flip-flop either transitions to a logic high state or a logic low state, or holds the previous output state, depending upon the data input state to the flip-flop and the state of the trigger to the device. Depending upon the configuration of the flip-flop, the device is either rising edge-triggered, or falling edge-triggered. Edge-triggered flip-flops are ubiquitous and allow for a simple clocking scheme. A rising edge-triggered flip-flop reads the state of the data input and then provides that data value at the output of the flip-flop upon the rising edge the synchronizing clock pulse. The output of the flip-flop is held equal to the previous output state at all times other than during the triggering event.

The standard approach to building a flip-flop is to connect two latches, a master and a slave, such that the output of the master latch provides the input to the slave latch. In the case of a rising edge-triggered flip-flop, a clock-low enabled master latch is followed by a clock-high enabled slave latch. A falling edge-triggered flip-flop would have the clock-high enabled master latch followed by a clock-low enabled slave.

The operation of a rising-edge triggered flip-flop is as follows: When the clock is low, data enters the master latch and is stored there. When the clock rises this data traverses to the slave latch and is visible at the output of the flip-flop. Since the rising clock disables the master latch, new data cannot replace the data that is held in the master latch. When the clock returns low, the output state of the slave latch is held constant, while the next data input state is read into the master latch. The process is then repeated.

The edge-triggered flip-flop is stable and requires a short hold-time, where hold time is defined as the amount of time that the data state must be held constant in order to ensure that it be properly written into the flip-flop upon the arrival of the clock state that allows data to be read by the master latch. The hold time is trivially met in most designs. If timing analysis shows that hold time failures are occurring, the problem can be solved by inserting delays into the fast paths of the design. This can be accomplished automatically by modern synthesis tools, generally with no timing penalty.

The principle limitation of the edge-triggered flip-flop is the propagation delay of the device, the time that it takes for the data to traverse through both latches of the flip-flop. The delay of the device is the sum of the "set-up time" and the "clock-to-q time." Set-up time is conventionally defined as the set-up time period of the master latch where the data is held before being presented to the slave latch, and clock-to-q time is defined as the time period from the triggering event until the time that the data is available at the output of the flip-flop. For deeply pipelined designs in deep sub-micron technologies, the propagation delay of the flip-flop consumes a large part of the total cycle time. The time required for set-up, clock-to-q and skew in the flip-flop can consume a large portion, sometimes approaching 40%, of the total cycle time.

Another approach to flip-flop design is to use a single latch in combination with a pulse generator, such as described in D. Harris, *Skew-Tolerant Design*, Morgan Kaufmann Publishers Inc., San Francisco, Calif., 2001. The pulse generator is used to generate a short pulse either on the rising or the falling edge of the clock. This pulse allows the latch to be transparent, i.e. able to read the input data, only for a short time period equal to the width of the pulse following the edge transition. While the pulsed latch has decreased propagation delay, it has the disadvantage of having an increased hold time requirement when compared to a conventional flip-flop.

Pulsed flip-flops can also be designed with a domino logic latch, instead of a static latch. Domino logic is a precharged, non-inverting family of CMOS logic that uses multiple clock phases to effect high-speed operation. Domino logic is faster than standard static logic, but it is more difficult to design because of its increased complexity, primarily in the clocking network. Although domino logic gates are faster than static gates, there are some advantages to using static gates. First, in a domino pulsed flip-flop, the AND logic gate of the pulse generator is part of the series of nMOS pull down transistors. In order to ensure acceptable speed, these transistors must be kept large, which leads to increased power dissipation in the clocking circuitry. Another disadvantage of a pulsed domino flip-flop is the requirement of a latch at the output to ensure that the precharge data value is not propagated into the following circuitry. Static logic has reduced power dissipation in comparison to domino logic, and reduced circuit complexity through the use of fewer gates.

Many domino logic flip-flops are designed to incorporate a scan test capability for testing circuit operation. During a scan test, data enters the flip-flop from another flip-flop or the scan test input. This mode is used to load a set of arbitrary data into the flip-flop to test the correct functionality or manufacture of the device. To incorporate scan test capability into a flip-flop, the data input, a scan test enable input, and the scan test input, are typically fed into a multiplexer. The output of the multiplexer ensures that scan testing can only occur when the test enable input is enabled, thereby providing two modes of operation for the flip-flop, a scan test mode and a data mode. When the test mode is disabled the circuit is in data mode, unable to read a scan test input. Therefore, the circuit can only read the data input or the scan test input, but not both simultaneously.

It would be advantageous if a flip-flop were designed that took advantage of the reduced power requirements of a pulsed static latch, the reduced circuit complexity of static logic, and incorporated a scan test capability to test circuit operation.

The present invention combines simple pulsed static latch circuitry with a scan test capability. In the present invention, the pulse generator circuitry is independent the latch gates, and can therefore be made small to reduce power dissipation. This reduction in power dissipation is combined with the fact that static logic gates consume less power than domino logic gates. The present invention also incorporates a scan test input that is independent of the data input, for testing circuit operation. The novel pulse generator of the present invention operates to automatically select the scan test or data mode of operation.

SUMMARY OF INVENTION

The present invention is a pulse-triggered static flip-flop having a scan test capability. A clock signal and a test enable signal are provided to a pulse generator that is isolated from the static flip-flop. The pulse generator produces a data enable trigger pulse and a test enable trigger pulse for triggering one of either a data input or a scan test input to the static flip-flop. The pulse generator generates the data enable pulse only when the test enable input is low. The pulse generator generates a scan test enable pulse only when the test enable input is high.

The pulse generator is preferably comprised of a series of inverters and NAND logic gates. The NAND gates are used to select whether the data enable pulse will be produced or the scan test enable pulse will be produced, based upon the state of the test enable input. NAND gates are also used to intersect the delayed clock signal with the original clock signal to produce the narrow trigger pulses.

The flip-flop portion of the present invention includes a selection circuit portion and a static hold circuit portion. The selection circuit selects either the data input or the scan test input. The selection circuit is controlled by the data enable trigger pulse and test enable trigger pulse. When the data enable pulse is operational, the selection circuit reads in the data input. When the test enable pulse is operational, the selection circuit reads in the scan test input.

The selection circuit consists of two latches. One latch reads in the data input, when enabled, and the other latch reads in the scan test input, when enabled. Each of the selection circuit latches consists of an inverter followed by a transmission gate. The transmission gates are controlled by the data enable trigger and scan test enable trigger pulses respectively.

The static hold circuit of the flip-flop consists of a keeper circuit which includes a feedback inverter and a static latch. The output from the data input transmission gate or the scan test transmission gate of the selection circuit, depending upon which is enabled, is fed into the keeper circuit. The static latch is additionally controlled by the data enable trigger pulse and test enable trigger pulse. The output of the keeper circuit is fed through an output inverter to produce the output Q of the circuit. The embodiment of the invention described herein has a single unified data and test output. A separate test output can be easily provided by using an extra output (not shown). Having a separate test output may be advantageous in some applications when the test output causes high loading and degrades the speed of the data output signal.

A primary object of the present invention is to provide a reduced set-up time, clock-to-q time and resulting propagation delay in a flip-flop. Another primary object of the present invention is to minimize power dissipation of a flip-flop through use of static logic. Still another primary object of the invention is to reduce power dissipation by isolating the pulse generator from the latch circuitry to reduce the amount of circuitry that the clock must drive. Yet another primary object of the invention is to incorporate a scan test capability into the static logic flip-flop. Still yet another primary object of the invention is to reduce power dissipation by disabling the data or scan test input early in the data or scan test path, based upon the mode of operation that is enabled.

A primary advantage of the present invention is a low set-up time. Another primary advantage of the present invention is a low clock-to-q time. Yet another primary advantage of the invention is the resulting low propagation delay. Still yet another primary advantage of the invention is low power dissipation. Still another primary advantage of the invention is that it includes a scan test input for testing circuit operation. Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF DRAWINGS

The accompanying drawings, which are incorporated into and form a part of the specification, illustrate a preferred embodiment of the present invention and, together with the description, serve to explain the principles of the invention. The drawings are not to be construed as limiting the invention.

DETAILED DESCRIPTION

Disclosed, according to a preferred embodiment of the present invention, is the design of a scannable, pulse-triggered flip-flop than can be tested for proper circuit operation. The architecture of such a flip-flop based on a static latch design is provided.

Figure 1:
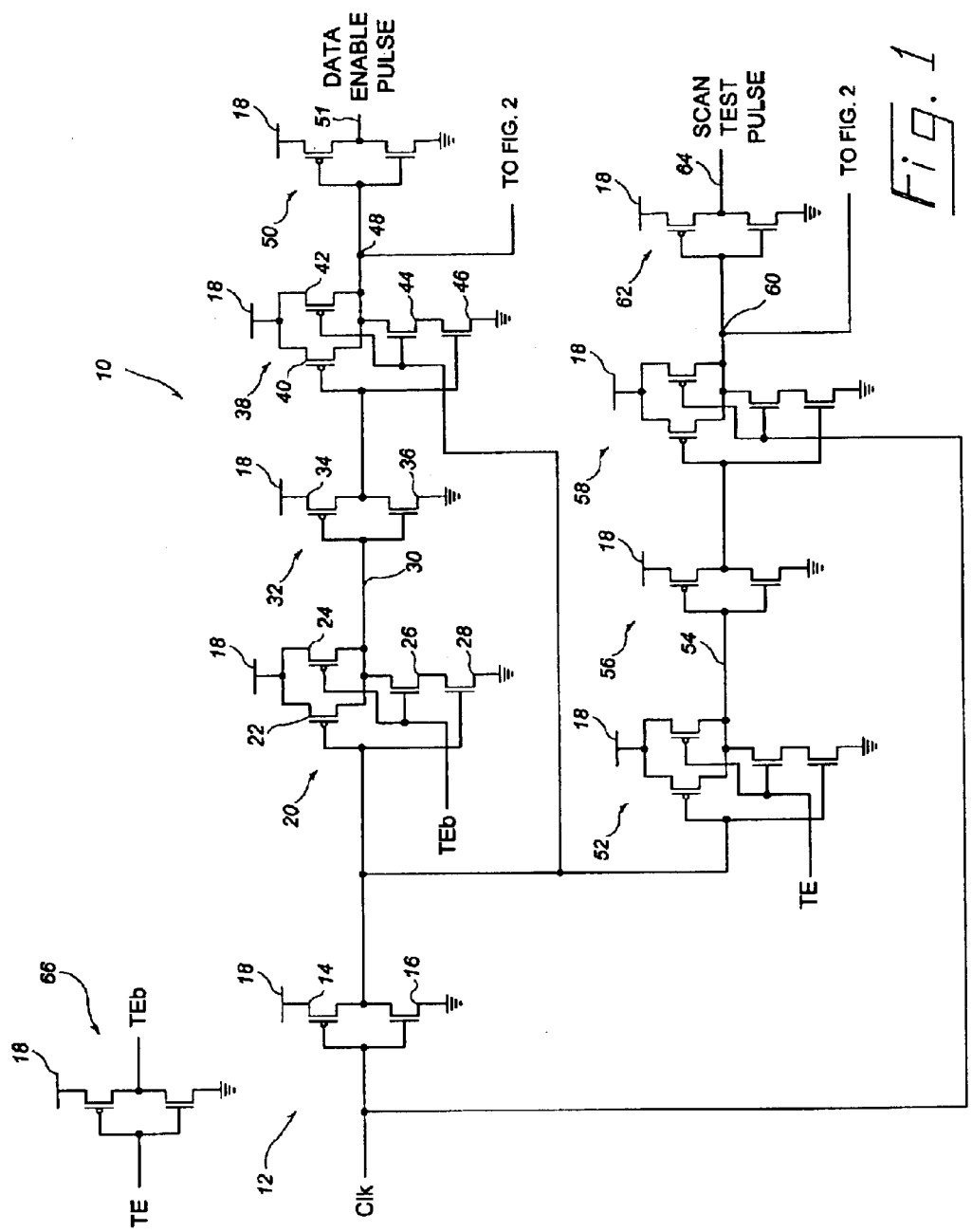
FIG. 1 is a schematic diagram of a preferred embodiment of a pulse generator circuit for driving a D-type latch circuit having scan testing capabilities in accordance with the invention.
Figure 2:
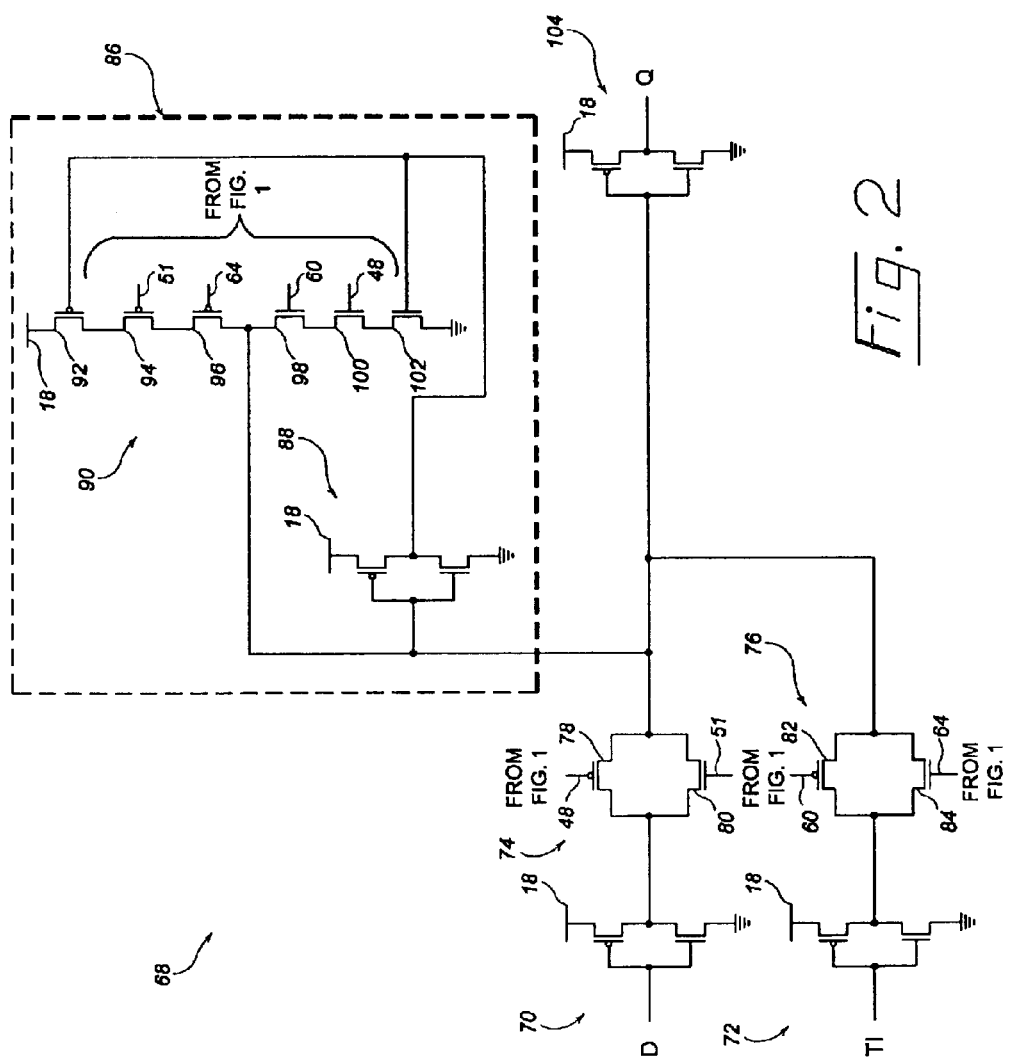
FIG. 2 is a schematic diagram of a preferred embodiment of a D-type latch circuit having scan testing capabilities and driven by the pulse generator circuit of FIG. 1.
Figure 1:
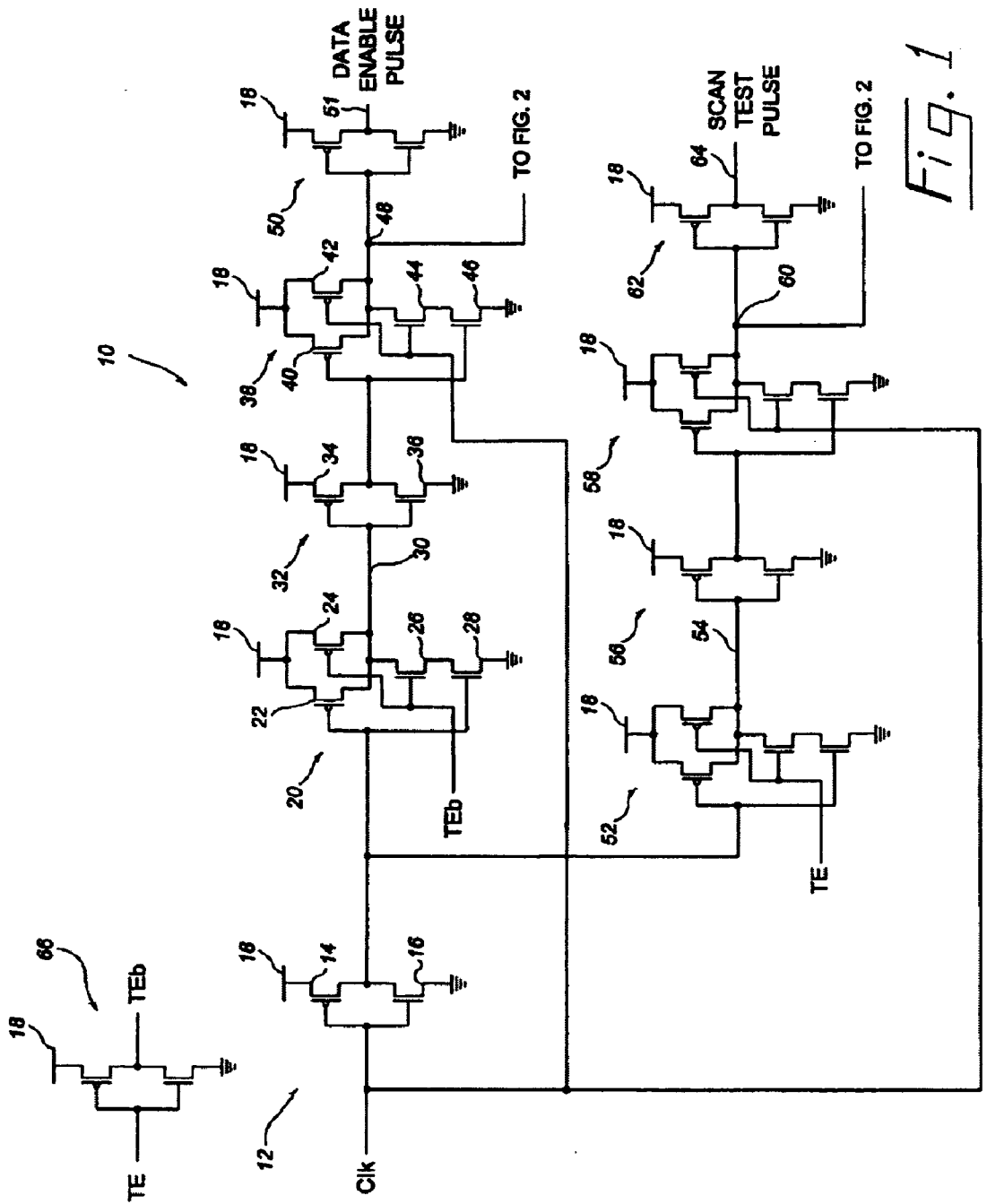

Referring to FIG. 1, a schematic diagram of a pulse generator circuit 10 for driving a D-type latch circuit having scan testing capabilities is shown. A clock, Clk, input is provided for producing the pulse trigger for reading the data input to the latch circuit of FIG. 2. The clock is also used to produce a pulsed test enable input for enabling a test input to the latch circuit of FIG. 2. The pulse generator circuit of FIG. 1 is designed so that the latch circuit of FIG. 2 can read either the data input or the test input, but not both simultaneously. Referring also to Table 1, a summary truth table showing the operation of the scannable, pulse-triggered flip-flop of the invention depicted in FIGS. 1 and 2 is provided:

TABLE 1

| | Data Input (D) | Pulse Trigger | Test Enable (TE) | Test Input (TI) | Output (Q) |
|---|---|---|---|---|---|
| Data Mode | D | false | low | X | hold |
| Data Mode | D | true | low | X | D |
| Test Mode | X | false | high | test input | hold |
| Test Mode | X | true | high | test input | test output |

When the test enable, TE, input is low, the circuit is in data mode and can only read the data input, D, to the latch circuit according to the level of the pulse trigger. When TE is high, the circuit is in test mode, and can accept a scan test input from the test input, TI, to the latch circuit of FIG. 2, but cannot read a data input, D. The design of the pulse generator circuit of FIG. 1 eliminates the requirement for a multiplexer circuit that is common to prior art scannable domino logic flip-flops. The pulse generator circuit of FIG. 1 is made up of a series of inverters and NAND logic gates. Small transistors are preferable to minimize power dissipation and external clock line loading. The Clk input is initially fed into a first inverter 12 made up of a PMOS transistor 14 and an NMOS transistor 16, where the clock signal is fed into the gates of the transistors, the source of the PMOS transistor 14 is connected to the power supply rail 18, and the source of NMOS transistor 16 is connected to ground. The output of inverter 12 is an inverted clock signal.

The inverted clock signal output of inverter 12 is fed into an input of a two-input NAND gate 20 having the logical complement of the TE signal as a second input (TEb). The complement of TE is provided by inverter 66. NAND gate 20 is comprised of two PMOS transistors 22 and 24 with sources connected to the power supply rail 18, and two NMOS transistors 26 and 28. The source of NMOS transistor 28 is connected to ground and its drain is connected to the source of NMOS transistor 26. The inverted clock signal is connected to the gates of PMOS transistor 22 and NMOS transistor 28, and TEb is connected to the gates of PMOS transistor 24 and NMOS transistor 26. So long as either or both of the inputs, the inverted clock and TEb, to NAND gate 20 are low, the output 30 of NAND gate 20 remains high. The output 30 of NAND gate 20 is low only when both inputs are simultaneously high.

Therefore, so long as TEb is high because TE is disabled, the output of NAND gate 20 will follow the inverted clock, which is the first step in creating the trigger pulse for reading input data to the latch circuit of FIG. 2.

The output 30 of NAND gate 20 is fed into a second inverter 32 made up of a PMOS transistor 34 and NMOS transistor 36, where NAND output 30 is fed into the gates of the transistors, the source of the PMOS transistor 34 is connected to the power supply rail 18, and the source of the NMOS transistor 36 is connected to ground. Inverter 32 inverts NAND output 30 before inputting it to the first input of a second two-input NAND gate 38. In the case where TEb is high, because TE is disabled, the output of inverter 32 will be the original clock signal, slightly delayed from passage through the previous gates.

NAND gate 38 is comprised of two PMOS transistors 40 and 42 with sources connected to the power supply rail 18, and two NMOS transistors 44 and 46. The source of NMOS transistor 46 is connected to ground and its drain is connected to the source of NMOS transistor 44. The output of inverter 32 is connected to the gates of PMOS transistor 40 and NMOS transistor 46, and the original clock signal is directly connected to the gates of PMOS transistor 42 and NMOS transistor 44. While either or both of the inputs to NAND gate 38 are low, the output 48 of NAND gate 38 remains high. The output 48 of NAND gate 38 is low only when both inputs are simultaneously high.

By intersecting the delayed clock output of the first NAND gate 20 with the original clock signal, NAND gate 38 produces the narrow data trigger pulse, but only when TEb is high. NAND output 48 is the data trigger pulse low input for the latch circuit of FIG. 2. NAND gate output 48 is inverted at inverter 50, to provide the trigger pulse high 51 input for the latch circuit of FIG. 2. Tracing through these same gates with TE held high, scan test enabled, reveals that the trigger output 51 will be low so long as TE is high.

Test enable, TE, follows a similar set of operations as the clock signal described above, resulting in a narrow test enable pulse to be fed into the latch circuit of FIG. 2, so long as TE is high. The TE input is fed into one input of a two-input NAND gate 52 having the inverted clock signal as the second input. Operation of NAND gate 52 is as described previously for other NAND gates, where the output 54 of the gate remains high except in the circumstance where both inputs are simultaneously high, in which case it becomes low. Output 54 of NAND gate 52 is fed into inverter 56, where it is inverted. The output of inverter 56 is input to two-input NAND gate 58, which has the original clock signal as a second input. The output 60 of NAND gate 58 is only low in the instance where both the output of inverter 56 and the clock signal inputs are simultaneously low. Output 60 is the pulsed test enable low input to the latch circuit of FIG. 2. The output 60 of NAND gate 58 is input to inverter 62 where the signal is inverted. The output 64 of inverter 62 is the pulsed test enable high input for the latch circuit of FIG. 2. However, if TE is low, the output 64 of inverter 62 is held low.

The logic configuration of the pulse generator circuit 10 of FIG. 1 ensures that the two operative modes, data and scan test mode, of the latch circuit of FIG. 2 cannot operate simultaneously. If TE is high, a pulsed test enable signal is produced at output 64 and output 51 is held low. If TE is low, a pulsed data enable signal is produced at output 51 and output 64 is held low. The data and test enable pulses are synchronously clocked and are also in close proximity to save power consumption. The pulse generator circuit obviates the need for clocking the remainder of the circuit shown in FIG. 2. Referring to FIG. 2, a schematic diagram of the preferred embodiment of a simple D-type latch circuit 68 having scan testing capabilities and driven by the pulse generator circuit 10 of FIG. 1 is shown. Data, D, is input to inverter 70 to produce the complement at the output of inverter 70. Scan test input, TI, is input to inverter 72 to produce its complement. The output of each inverter 70 and 72 is input to a transmission gate latch, 74 and 76 respectively. Transmission gate 74 is made up of a PMOS transistor 78 and NMOS transistor 80 each having their sources connected to the output of inverter 70. The PMOS transistor 78 is clocked at its gate by the data pulse low signal 48 produced by the pulse generator circuit 10 of FIG. 1. NMOS transistor 80 is clocked at its gate by the data pulse high signal 51 produced by the pulse generator circuit 10.

Transmission gate 76 is made up of a PMOS transistor 82 and NMOS transistor 84 each having their sources connected to the output of inverter 72. The PMOS transistor 82 is clocked at its gate by the test enable pulse low signal 60 produced by the pulse generator circuit 10 of FIG. 1. NMOS transistor 84 is clocked at its gate by the test enable pulse high signal 64 produced by the pulse generator circuit 10. The scan test path transistors are preferably small as the scan path is not speed critical. This also reduces loading on the data input path.

Thus, the data trigger pulse and scan test trigger pulse, which clock the respective transmission gates 74 and 76, ensure that the data input, D, and scan test input, TI, cannot simultaneously be read into the circuit. When there is no trigger pulse, the input is disabled at this early stage in the circuit to avoid unnecessary power dissipation.

Alternatively, input inverters 70 and 72 can each be replaced by a logic gate, such as an AND gate, OR gate, or multiplexer. This additional logic can be utilized by the synthesis tool to further reduce delay. This substitution is particularly applicable to pulsed flip-flop because they have low set-up times.

The dynamic, pulsed output of the data and scan test transmission gates, 74 and 76, only one of which is operational at any given time based upon which mode is enabled, is input to keeper circuit 86. Keeper circuit 86 also operates as an additional mechanism for ensuring that data and scan test are not simultaneously operational, being disabled by either the scan test enable or the data pulse trigger input.

Keeper circuit 86 operates to staticize the data input, or scan test data depending upon the mode of operation. Keeper circuit 86 includes a feedback inverter 88, the output of which is held by latch 90. Latch 90 includes three PMOS transistors 92, 94 and 96 and three NMOS transistors 98, 100, and 102. The output from inverter 88 is input to the gates of PMOS transistor 92 and NMOS transistor 102. The source of PMOS transistor 92 is tied to the power rail and the source of NMOS transistor 102 is tied to ground.

Data trigger pulse high input 51 is input to the gate of PMOS transistor 94 and the scan test enable high input 64 is input to the gate of PMOS transistor 96. The drain of PMOS transistor 92 is fed into the source of PMOS transistor 94 and the drain of PMOS transistor 94 is fed into the source of PMOS transistor 96. If both the data pulse and the scan test pulse were simultaneously high, the keeper circuit 90 would be disabled.

Scan test enable low input 60 is input to the gate of NMOS transistor 98 and data trigger pulse low 48 is input to the gate of NMOS transistor 100. The drain of NMOS transistor 102 is fed into the source of NMOS transistor 100 and the drain of NMOS transistor 100 feeds the source of NMOS transistor 98.

The drains of PMOS transistor 96 and NMOS transistor 98 together form a node that is input back through inverter 88 of keeper circuit 86. The output node from the drains of PMOS transistor 96 and NMOS transistor 98 is then fed through output inverter 104 to prevent or reduce noise at the circuit output Q. Benefits of the present invention were demonstrated by a comparison between the present invention and the standard fast flip-flop. The comparison revealed a significant improvement in set-up time in the present invention. The set-up time for the standard flip-flop was 300 ps while the set-up time for the inventive flip-flop was 50 ps. A negative set-up time indicates that the data can arrive 50 ps after the clock signal. The clock-to-q delay of the invention was improved approximately 10% over that of the standard flip-flop.

Implementation of the present invention in synthesized designs revealed a decreased propagation delay. Two finite impulse response (FIR) filters were synthesized, one using the present invention and the other with standard flip-flops. The propagation delay was 2.72 ns using standard flip-flops and 2.29 ns using the present invention.

A critical path in a microprocessor core was synthesized first with standard flip-flop and then with the present invention. With standard flip-flop technology, the propagation delay was 3.96 ns. With the present invention, the delay was reduced to 3.47 ns.

Although the invention has been described in detail with reference to this preferred embodiment, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

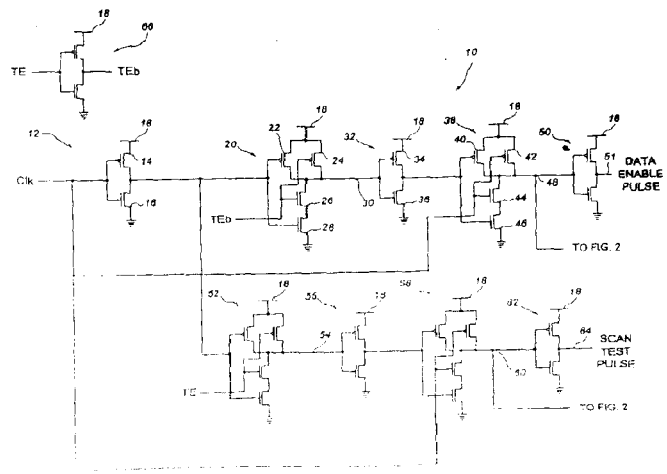

What is claimed is:

1. A logic circuit, comprising:
    a clock signal input having first and second states;
    a test enable input having first and second states; and
    a pulse generator for producing a pulsed data enable signal from a combination of a first clock signal derived from said clock signal input and a delayed version of said first clock signal when said test enable input comprises a first state, and for producing a pulsed scan test enable signal from a combination of a second clock signal derived from said clock signal input and a delayed version of said second clock signal when said test enable input comprises a second state.

2. The logic circuit of claim 1 wherein said first clock state comprises a low state, and said second clock state comprises a high state.

3. The logic circuit of claim 1 wherein said first test enable state comprises a low state, and said second test enable state comprises a high state.

4. The logic circuit of claim 1 wherein said pulse generator comprises at least one logic gate comprising:
    at least two inputs, each of said inputs having a first state and a second state; and
    an output having a first state and a second state, wherein said output is in a second state when either or both of said inputs are in a first state, and wherein said output is in a first state when both of said inputs are in a second state.

5. A logic circuit, comprising:
    a clock signal input having first and second states;
    a test enable input having first and second states; and
    a pulse generator for producing a pulsed data enable signal from said clock signal when said test enable input comprises a first state, and for producing a pulsed scan test enable signal from said clock signal when said test enable input comprises a second state;
    wherein said pulse generator comprises at least one logic gate comprising:
        at least two inputs, each of said inputs having a first state and a second state; and
        an output having a first state and a second state, wherein said output is in a second state when either or both of said inputs are in a first state, and wherein said output is in a first state when both of said inputs are in a second state; and
    the at least one logic gate comprising:
        an input having a first state and a second state; and
        an output, said output in a first state when said input is in a second state, said output in a second state when said input is in a first state.

6. A static latch circuit, comprising:
    a data input having a first and a second state;
    a test input;
    a selection circuit for selecting one of said data input or said test input for connection to an output; and
    a static hold circuit in electrical communication with said output and operating responsive to the data input and test input to staticize the selected one of said data input or said test input on the output;
    wherein said keeper static latch further comprises:
        a pulsed data enable input; and
        a pulsed test enable input.

7. The static latch circuit of claim 6 wherein said selection circuit and said static hold circuit comprise a flip flop.

8. The static latch circuit of claim 6 further comprising:
   a pulsed data enable input; and
   a pulsed test enable input.

9. The static latch circuit of claim 8 wherein said pulsed data enable input and said pulsed test enable input are in electrical communication with said selection circuit.

10. The static latch circuit of claim 9 wherein said selection circuit comprises a data input latch and a test input latch.

11. The static latch circuit of claim 10 wherein each of said data input latch and said test input latch comprises:
    an inverter; and
    a transmission gate.

12. The static latch circuit of claim 11 wherein said pulsed data enable input is input to said data input latch transmission gate and said pulsed test enable input is input to said test input latch transmission gate.

13. The static latch circuit of claim 6 wherein said static hold circuit comprises a keeper circuit.

14. The static latch circuit of claim 13 wherein said keeper circuit comprises an inverter and a static latch.

15. The static latch circuit of claim 6 further comprising an output inverter.

16. A scan test compatible pulse-triggered static flip-flop, comprising:
    a clock input;
    a test enable input;
    a data input;
    a scan test input;
    a pulse generator for producing a pulsed data enable signal from said clock signal when said test enable input comprises a first state, and for producing a pulsed scan test enable signal from said clock signal when said test enable input comprises a second state; and
    a static flip-flop, for receiving said data input, scan test input, and said pulse generator output.

17. The scan test compatible pulse-triggered static flip-flop of claim 16 wherein said pulse generator comprises NAND logic gates and inverters.

18. The scan test compatible pulse-triggered static flip-flop of claim 16 wherein said static flip-flop comprises:
    a first latch comprising said data input, said first latch clocked by said pulsed data enable output; and
    a second latch comprising said scan test input, said second latch clocked by said pulsed scan test enable output.

19. The scan test compatible pulse-triggered static flip-flop of claim 18 further comprising a static latch for holding an output from one of said first or said second latch.

20. A logic circuit, comprising:
    a clock signal input having first and second states;
    a test enable input having first and second states; and
    a pulse generator for producing a pulsed data enable signal from and narrower than said clock signal when said test enable input comprises a first state, and for producing a pulsed scan test enable signal from and narrower than said clock signal when said test enable input comprises a second state.

* * * * *

UNITED STATES PATENT AND TRADEMARK OFFICE
CERTIFICATE OF CORRECTION

PATENT NO. : 6,911,845 B2
DATED : June 28, 2005
INVENTOR(S) : Razak Hossain and Marco Cavalli It is certified that error appears in the above-identified patent and that said Letters Patent is hereby corrected as shown below:

The Title Page, the illustrative Fig. 1 should be replaced with attached Fig. 1.

Drawing Sheet 1 of 2 should be replaced with attached Fig. 1.

Column 3,
Line 50, insert -- inverter -- after "out put".

Signed and Sealed this

Tenth Day of January, 2006

JON W. DUDAS
*Director of the United States Patent and Trademark Office*

(12) United States Patent
Hossain et al.

(10) Patent No.: US 6,911,845 B2
(45) Date of Patent: Jun. 28, 2005

(54) PULSE TRIGGERED STATIC FLIP-FLOP HAVING SCAN TEST

(75) Inventors: Razak Hossain, San Diego, CA (US); Marco Cavalli, Gambara (IT)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/249,353

(22) Filed: Apr. 2, 2003

(65) Prior Publication Data

US 2004/0196067 A1 Oct. 7, 2004

(51) Int. Cl.7 .............................................. H03K 19/096
(52) U.S. Cl. .......................... 326/93; 326/113; 326/98; 326/95; 327/200; 327/208; 327/218; 327/211; 327/213
(58) Field of Search ............................. 326/93, 95, 98, 326/113; 327/208–212, 214, 224, 225; 714/724, 725

(56) References Cited

U.S. PATENT DOCUMENTS

| | | | |
|---|---|---|---|
| 5,189,319 A | * | 2/1993 | Fung et al. .................... 326/86 |
| 5,625,303 A | * | 4/1997 | Jamshidi ....................... 326/106 |
| 6,448,829 B1 | * | 9/2002 | Saraf .............................. 327/200 |
| 6,686,775 B2 | * | 2/2004 | Campbell ....................... 326/93 |

OTHER PUBLICATIONS

Harris, Skew–Tolerant Circuit Design, Academic Press, 2001, pp. 51–60, 211–217.

* cited by examiner

Primary Examiner—Vibol Tan
(74) Attorney, Agent, or Firm—Lisa K. Jorgenson; Andre M. Szuwalski

(57) ABSTRACT

A testable, pulse-triggered static flip-flop. A pulse generator produces a data enable trigger pulse only when a test enable input is low, and a scan test enable trigger pulse only when a test enable input is high. The data enable trigger pulse controls the data input to the flip-flop, while the scan test enable trigger pulse controls the scan test input to the flip-flop. The flip-flop consists of a selection circuit comprised of two latches, each including an inverter and a transmission gate. One latch receives the data input and the other latch receives the scan test input. The data enable trigger pulse controls the transmission gate receiving the data input, and the scan test trigger pulse controls the transmission gate receiving the scan test input. The flip-flop also includes a keeper circuit consisting of a feedback inverter and a static latch.

20 Claims, 2 Drawing Sheets